(12) United States Patent
Coughlin, Jr.

(10) Patent No.: US 7,257,781 B2
(45) Date of Patent: Aug. 14, 2007

(54) METHOD, CIRCUIT LIBRARY AND COMPUTER PROGRAM PRODUCT FOR IMPLEMENTING ENHANCED PERFORMANCE AND REDUCED LEAKAGE CURRENT FOR ASIC DESIGNS

(75) Inventor: Terry C. Coughlin, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 10/760,502

(22) Filed: Jan. 20, 2004

(65) Prior Publication Data

US 2005/0160385 A1 Jul. 21, 2005

(51) Int. Cl.
G06F 17/50 (2006.01)

(52) U.S. Cl. .............................. 716/2; 716/11

(58) Field of Classification Search ...................... None
See application file for complete search history.

(56) References Cited

U.S. PATENT DOCUMENTS

| | | | | |
|---|---|---|---|---|
| 4,595,845 A | * | 6/1986 | Briggs ........................ 326/113 |
| 5,666,288 A | * | 9/1997 | Jones et al. .................... 716/17 |
| 5,780,912 A | * | 7/1998 | Burr et al. .................. 257/408 |
| 6,078,195 A | * | 6/2000 | Chen .......................... 326/121 |
| 6,668,358 B2 | * | 12/2003 | Friend et al. ................... 716/2 |
| 6,849,492 B2 | * | 2/2005 | Helm et al. ................. 438/217 |

* cited by examiner

Primary Examiner—Leigh M. Garbowski
(74) Attorney, Agent, or Firm—Joan Pennington

(57) ABSTRACT

A method, apparatus and computer program product are provided for implementing application specific integrated circuit (ASIC) designs having high performance and reduced leakage current. Standard voltage threshold (SVT) circuits in a SVT circuit library are identified. For each SVT circuit, each SVT PFET is replaced with a low voltage threshold (LVT) PFET to provide a hybrid alternate voltage threshold (AVT) circuit. Then the AVT circuits are saved in an alternate voltage threshold circuit library. The AVT circuit library provides enhanced performance as compared to the SVT circuit library without the high leakage current resulting from a LVT circuit library.

9 Claims, 9 Drawing Sheets

300

LVT PFET 302

LVT SHAPE

SVT NFET 304

METHOD, CIRCUIT LIBRARY AND COMPUTER PROGRAM PRODUCT FOR IMPLEMENTING ENHANCED PERFORMANCE AND REDUCED LEAKAGE CURRENT FOR ASIC DESIGNS

FIELD OF THE INVENTION

The present invention relates generally to the data processing field, and more particularly, relates to a method, circuit library and computer program product for implementing application specific integrated circuit (ASIC) designs having enhanced high performance and reduced leakage current.

DESCRIPTION OF THE RELATED ART

The current trend in CMOS integrated circuit library design is to offer multiple threshold voltage (VT) variations of the circuit library. Known circuit libraries include circuits formed of standard VT (SVT) devices, or circuits formed of low VT (LVT) devices. Typically, SVT devices are used in a normal circuit design.

FIG. 1A shows a schematic of an SVT inverter circuit in a Standard Cell Library, and FIG. 1B shows the corresponding SVT layout.

FIG. 2A shows a schematic of an LVT inverter circuit in a Standard Cell Library, and FIG. 2B is the corresponding LVT layout. For high performance, circuits comprised of 100% LVT devices can be substituted for their normal and longer delay SVT counterparts. A disadvantage of this approach is that the leakage current of the LVT implementation is higher than that of the SVT implementation.

Low threshold voltages offer the highest circuit performance available in each technology at the cost of increased leakage current. There are two main components of IC leakage current. The dominant leakage current component is the leakage from drain to source of the device which is exacerbated in the LVT devices. LVT field effect transistors (FETS) turn on faster than standard SVT FET devices, but never really turn off fully when the gate voltage is below threshold allowing the leakage current to pass from the drain to source. The second leakage current component is gate tunneling leakage current caused by the thin oxide of the device gate. A thin oxide on the gate does not completely insulate the device and allows leakage current to pass through the gate.

Several techniques have been used to address the leakage problem such as using only high performance LVT circuits in the critical path and using the slower circuits with less leakage elsewhere on the chip. Circuit libraries are available in several variations of VTs which can be mixed and matched throughout the chip. Very complex chip methodologies are used to determine where a LVT circuit should be used in place of a Standard VT (SVT) circuit to increase performance. There are hard limits on the number of LVT circuits used on a chip to keep the leakage current under control. The goal is to get the highest performing circuits paths without violating leakage current limits. Using this technique a chip would be laid out using circuits from the SVT library. A timing run would be performed to determining the critical path circuits. Circuits in the critical path would be replaced with the logically equivalent circuits from the LVT library until the maximum number of LVT circuits is used to meet the leakage power requirement. This iterative process can consume many hour of CPU time performing chip layout, RC extraction and timing analysis before a final design is complete.

A need exists for a mechanism for implementing application specific integrated circuit (ASIC) designs having high performance and reduced leakage current.

SUMMARY OF THE INVENTION

Important aspects of the present invention are to provide a method, circuit library and computer program product for implementing application specific integrated circuit (ASIC) designs having enhanced performance and reduced leakage current. Other important aspects of the present invention are to provide such method, circuit library and computer program product for implementing application specific integrated circuit (ASIC) designs having enhanced performance and reduced leakage current substantially without negative effect and that overcome some of the disadvantages of prior art arrangements.

In brief, a method, apparatus and computer program product are provided for implementing application specific integrated circuit (ASIC) designs having enhanced performance and reduced leakage current. Standard voltage threshold (SVT) circuits in a SVT circuit library are identified. For each SVT circuit, each SVT PFET is replaced with a low voltage threshold (LVT) PFET to provide a hybrid alternate voltage threshold (AVT) circuit. Then the AVT circuits are saved in an alternate voltage threshold circuit library.

In accordance with features of the invention, the alternate voltage threshold circuit library provides enhanced performance as compared to the SVT circuit library without the high leakage current resulting from a LVT circuit library. For every circuit in the SVT library a single shape or low voltage threshold mask is added over the Nwell region to convert the SVT PFETs to LTV PFETs. Converting the SVT PFETs to LVT PFETs results in a much faster rise time for any given circuit.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, a method is provided to solve to the leakage problem that implements an alternate circuit library having an alternate voltage threshold (AVT). The AVT library is a compromise library between the conventional SVT library and the conventional LVT library. The AVT library results in enhanced or improved performance over the conventional SVT library and in reduced leakage current than the conventional LVT library with the added cost of only an additional processing mask.

In accordance with features of the preferred embodiment, the AVT circuit library has been designed that has higher performance as compared to the SVT circuit library without the high leakage of the LVT circuit library. The improved results in performance and leakage current parameters are achieved using the AVT circuit library without the added cost of the AVT mask for processing.

In accordance with features of the invention, all the PFETs in the SVT circuit library are replaced with LVT PFETS. Due to the nature of PFETs, PFETs are larger and slower than NFETs in any given CMOS technology. Converting the SVT PFETs to LVT PFETs results in a much faster rise time for any given circuit. The SVT NFET controls the leakage current to ground when the NFET is in the off state. Assuming an even distribution of "1" and "0" states on a chip, the SVT NFET keeps the leakage current to one-half the leakage current that an equivalent LTV circuit would allow. The fall time of the SVT NFET remains the same, but the circuit is more balanced because the faster rise time of the LVT PFETs more closely matches the fall time of SVT NFET's.

Figure 1A:
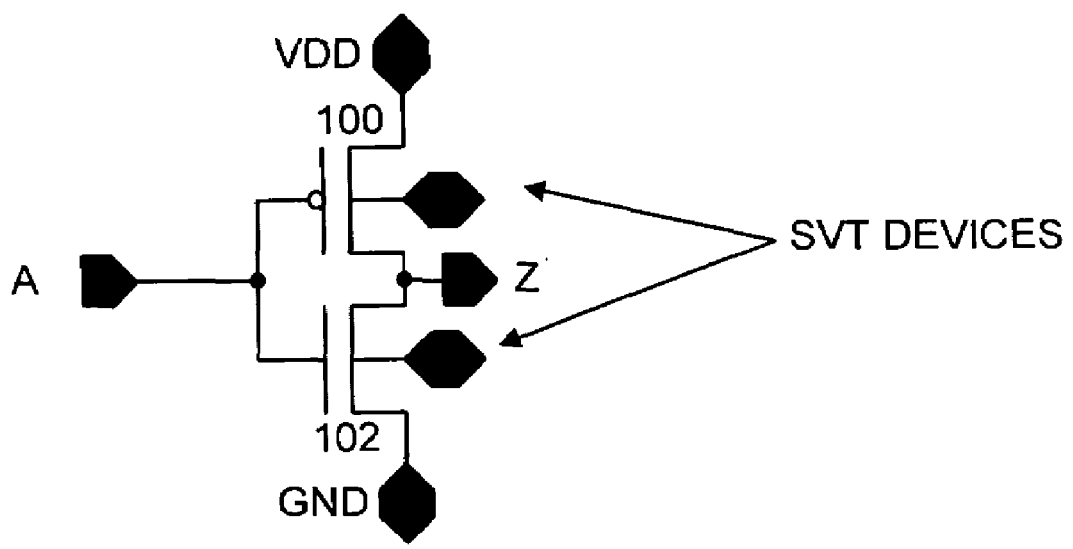
FIGS. 1A and 1B illustrate a conventional SVT inverter circuit.
Figure 1B:
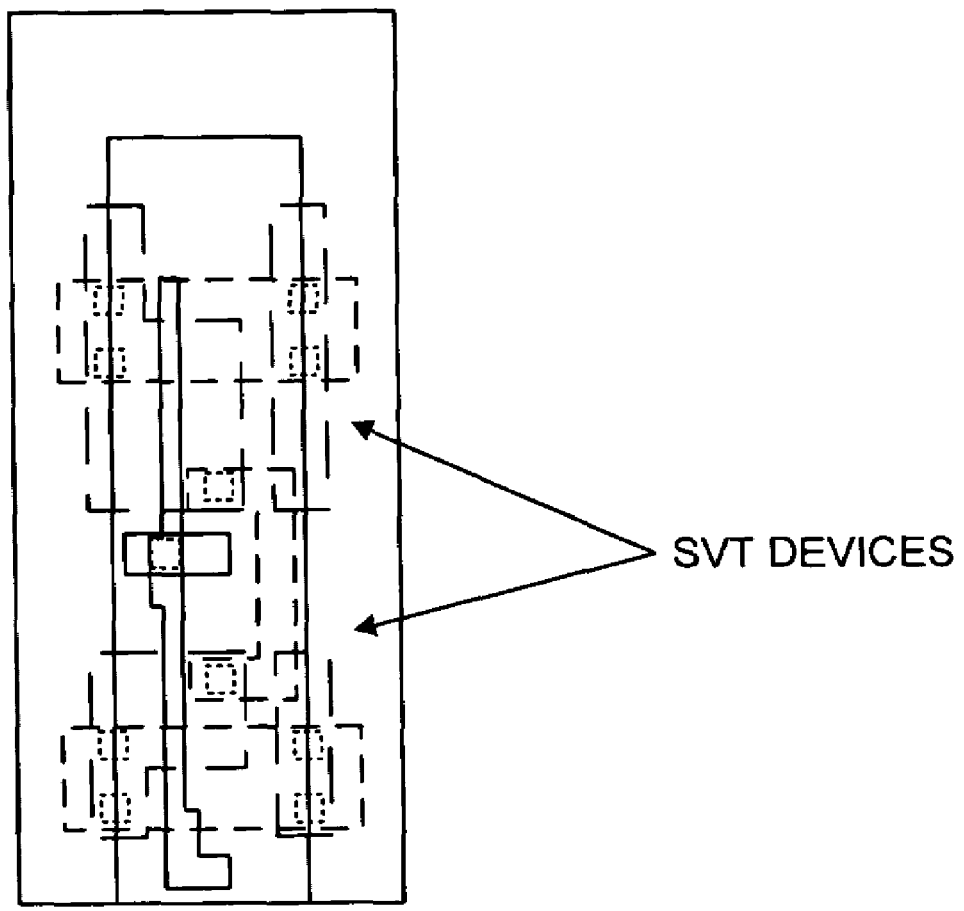
Figure 2A:
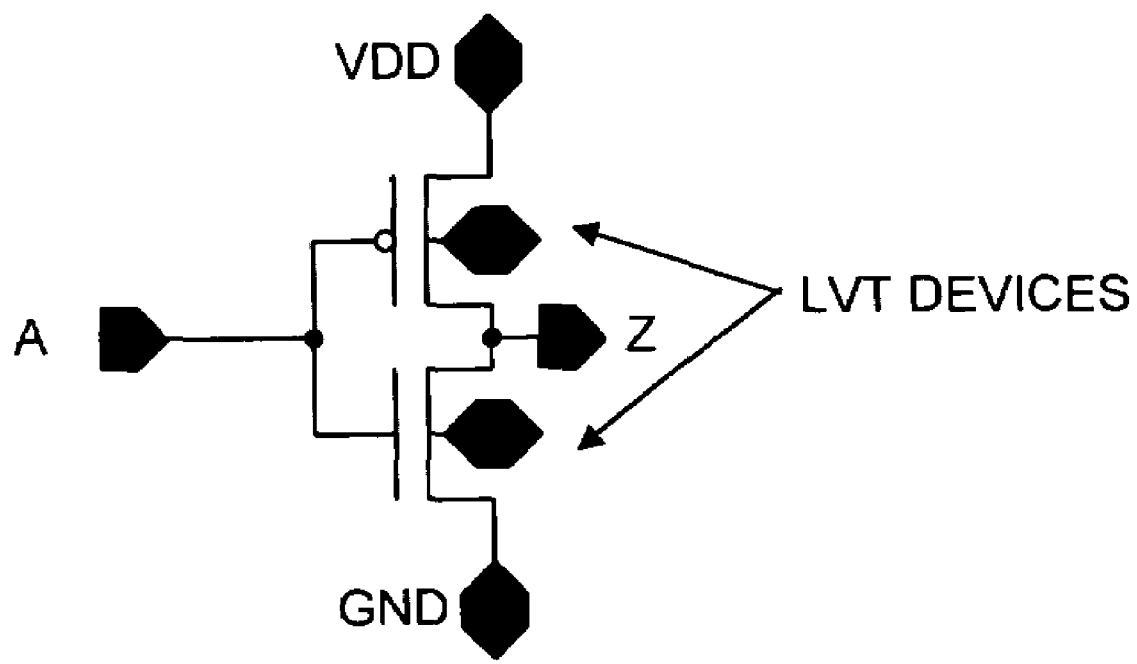
FIGS. 2A and 2B illustrate a conventional LVT inverter circuit.
Figure 2B:
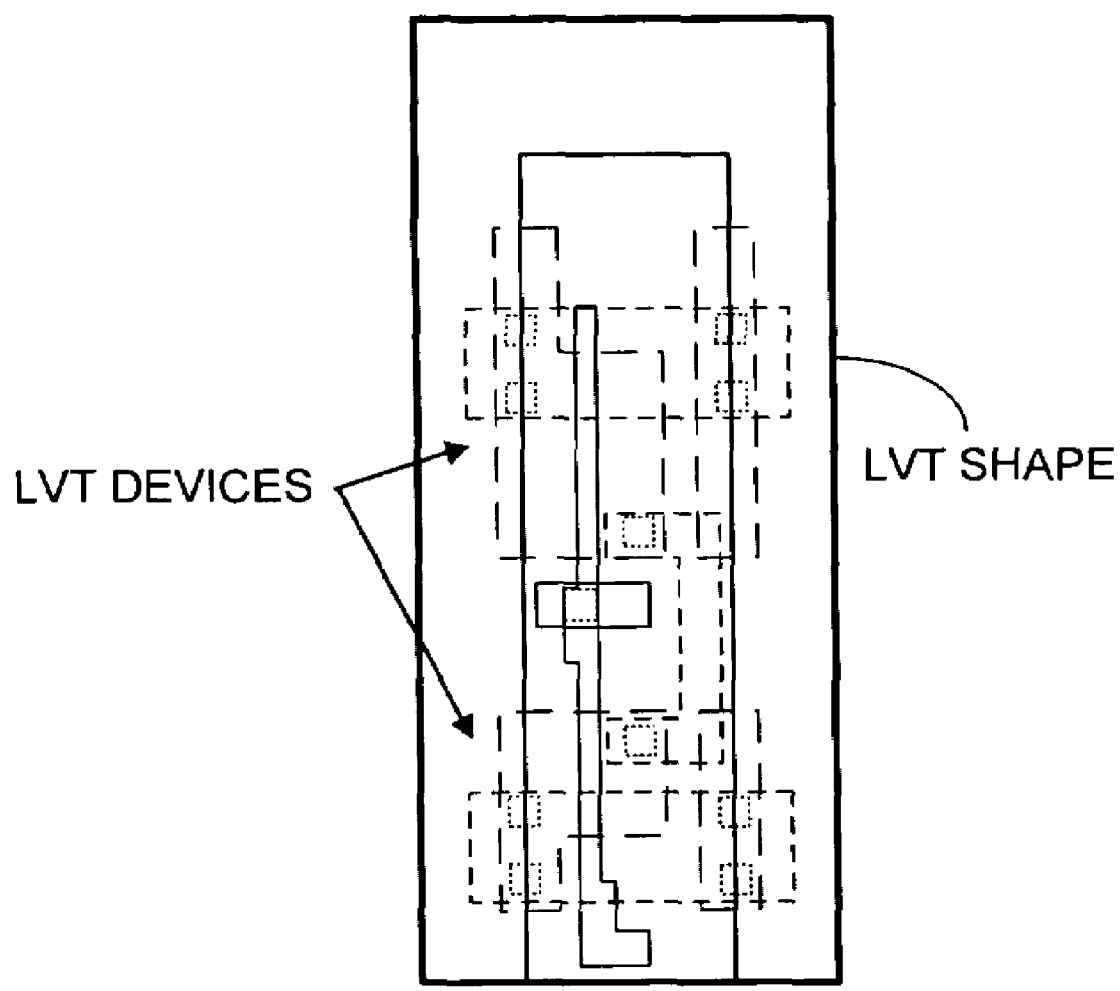
Figure 3A:
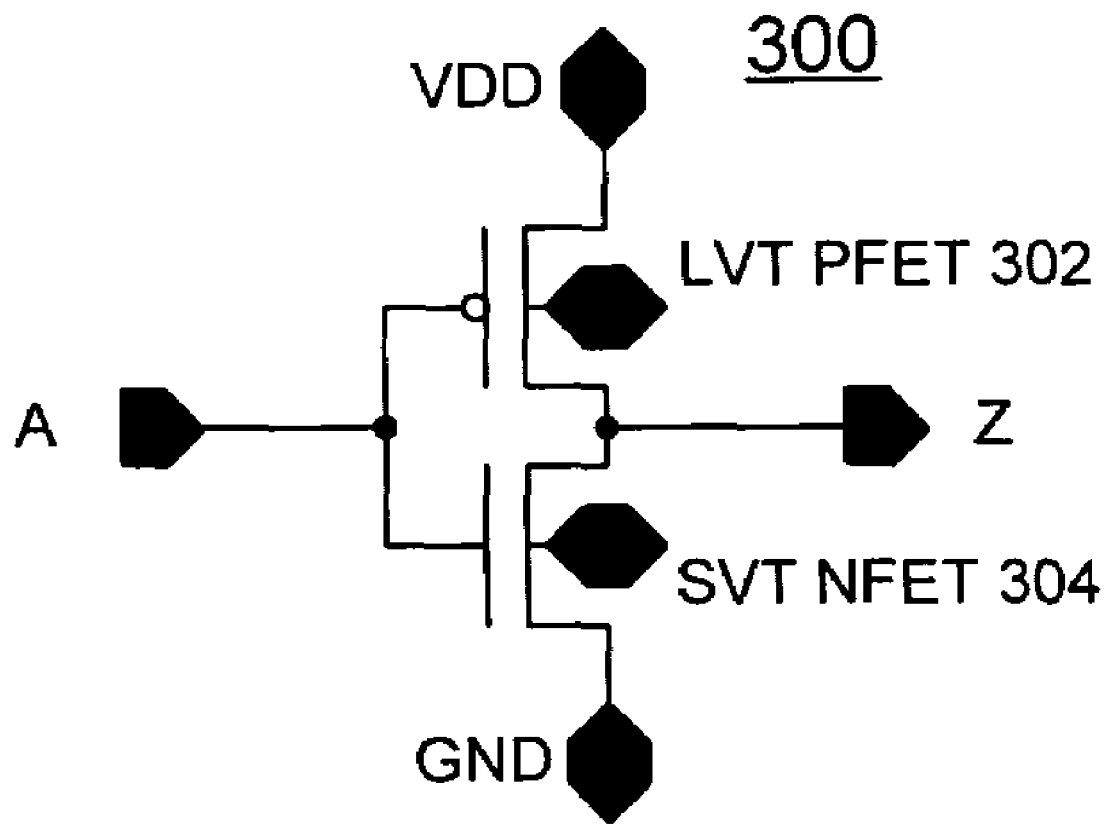
FIGS. 3A and 3B illustrate an alternate voltage threshold (AVT) inverter circuit in accordance with the preferred embodiment.
Figure 3B:
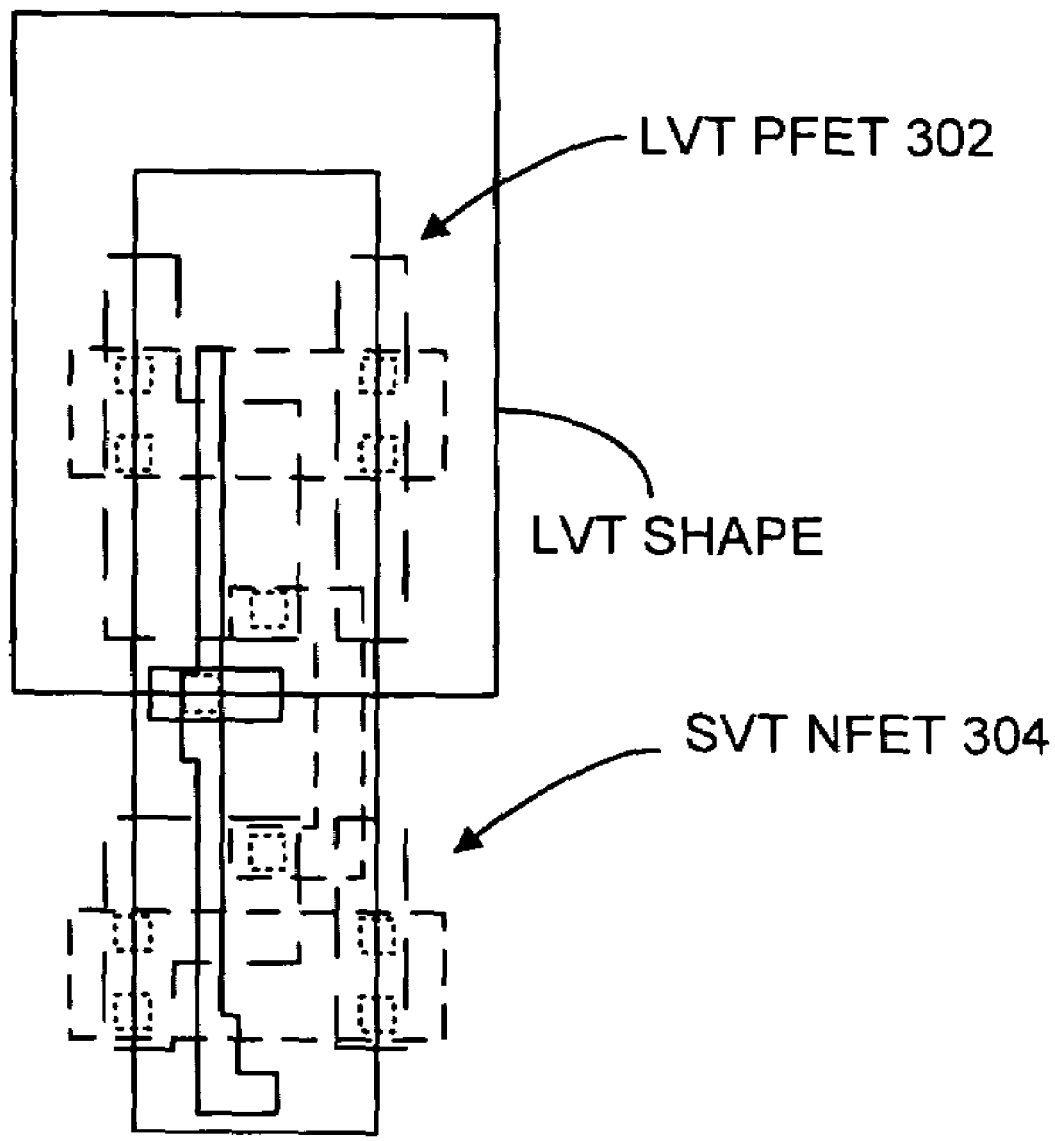

Referring now to the drawings, in FIGS. 3A and 3B, there is shown an exemplary inverter circuit generally designated by the reference character 300 implemented in accordance with a method of the preferred embodiment. FIG. 3A shows a schematic of the new inverter circuit 300 stored in a standard cell AVT library, and FIG. 3B show the corresponding layout of the new inverter circuit 300 of the invention. The inverter circuit 300 is used to demonstrate an exemplary implementation of the method and the AVT circuit of the AVT circuit library of the invention. It should be understood that the present invention is not limited to the illustrated inverter circuit 300, each circuit in a SVT circuit library is processed and stored in the AVT circuit library of the invention.

The inverter circuit 300 includes a series connected P-channel field effect transistor (PFET) 302 and an N-channel field effect transistor (NFET) 304, each having an gate receiving an input A and providing an inverted output labeled Z at a common drain connection.

In accordance with features of the invention, the PFET 302 is a LVT device and the NFET 304 is a SVT device. As shown in FIG. 3B, a low voltage threshold mask or LVT shape is added only over the Nwell Region to convert a SVT PFET to the LTV PFET 302. The PFET 302 is isolated from the NFET 304 and the NFET 304 is maintained as a SVT NFET.

In accordance with features of the invention, implementation of the AVT circuit library of the invention is very simple due to the nature of standard cell or gate array layouts. All the PFETs in the Nwell Region are isolated from the NFETs. For every circuit in the SVT library, a single shape or low voltage threshold mask is added over the Nwell region to convert the SVT PFETs to LTV PFETs. Once an SVT library is designed, an entire hybrid AVT library can be post-processed in minutes.

Figure 4:
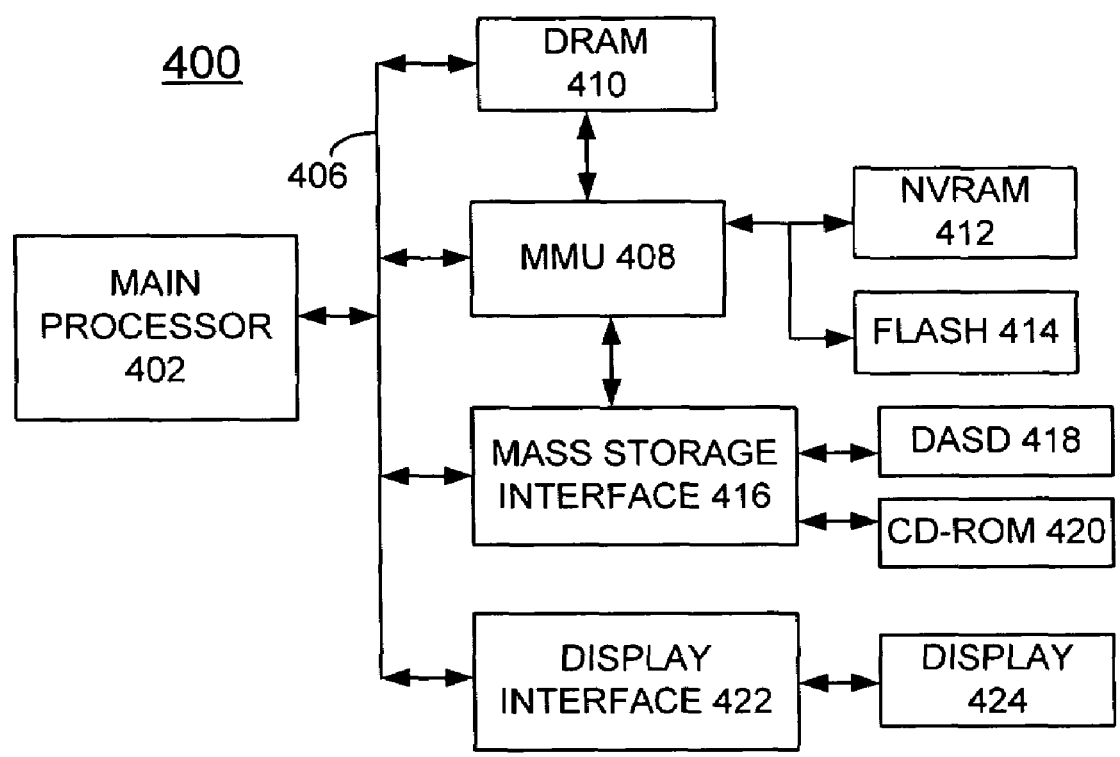
FIGS. 4 and 5 are block diagram representations illustrating a computer system and operating system for implementing application specific integrated circuit (ASIC) designs having enhanced performance and reduced leakage current in accordance with the preferred embodiment.
Figure 5:
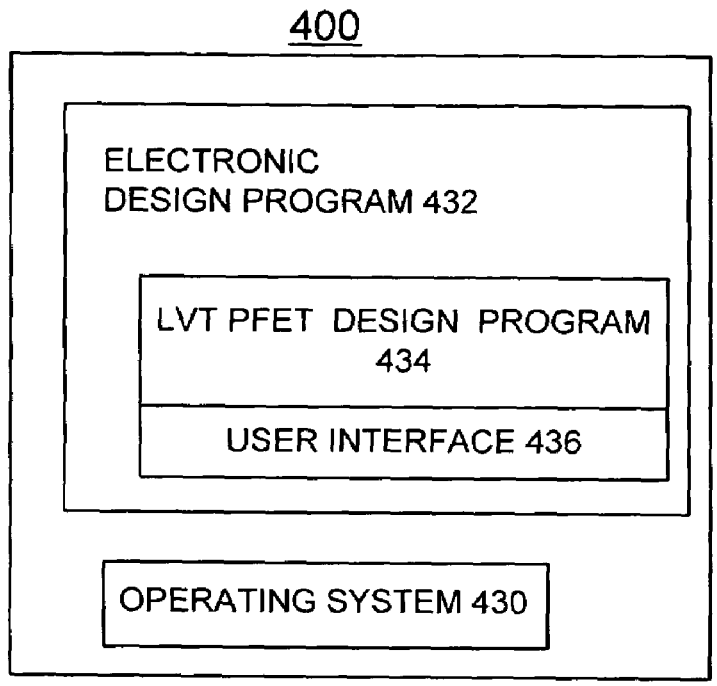

Referring now to the drawings, in FIGS. 4 and 5 there is shown a computer system generally designated by the reference character 400 for implementing enhanced performance with reduced leakage current for ASIC designs in accordance with the preferred embodiment. Computer system 400 includes a main processor 402 or central processor unit (CPU) 402 coupled by a system bus 406 to a memory management unit (MMU) 408 and system memory including a dynamic random access memory (DRAM) 410, a nonvolatile random access memory (NVRAM) 412, and a flash memory 414. A mass storage interface 416 coupled to the system bus 406 and MMU 408 connects a direct access storage device (DASD) 418 and a CD-ROM drive 420 to the main processor 402. Computer system 400 includes a display interface 422 coupled to the system bus 406 and connected to a display 424.

Computer system 400 is shown in simplified form sufficient for understanding the present invention. The illustrated computer system 400 is not intended to imply architectural or functional limitations. The present invention can be used with various hardware implementations and systems and various other internal hardware devices, for example, multiple main processors.

As shown in FIG. 5, computer system 400 includes an operating system 430, an electronic package design program 432, a LVT PFET design program 434 of the preferred embodiment, and a user interface 436.

Figure 6:
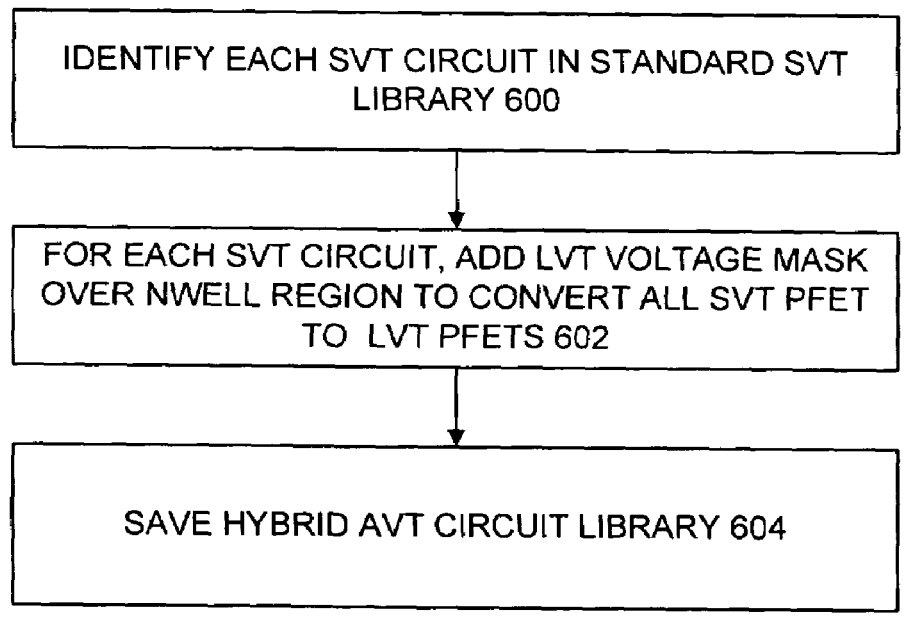
FIG. 6 is a flow chart illustrating exemplary steps for implementing application specific integrated circuit (ASIC) designs having enhanced performance and reduced leakage current in accordance with the preferred embodiment.

Referring now to FIG. 6, there are shown exemplary steps for implementing enhanced performance with reduced leakage current for ASIC designs in accordance with the preferred embodiment. Standard voltage threshold (SVT) circuits in a SVT circuit library are identified as indicated in a block 600. For each SVT circuit, an LVT votage threshold mask is added over the Nwell region to convert all SVT PFETs low voltage threshold (LVT) PFETs to provide a hybrid alternate voltage threshold (AVT) circuit as indicated in a block 602. Then the AVT circuits are saved in an alternate voltage threshold (AVT) circuit library as indicated in a block 604.

Figure 7:
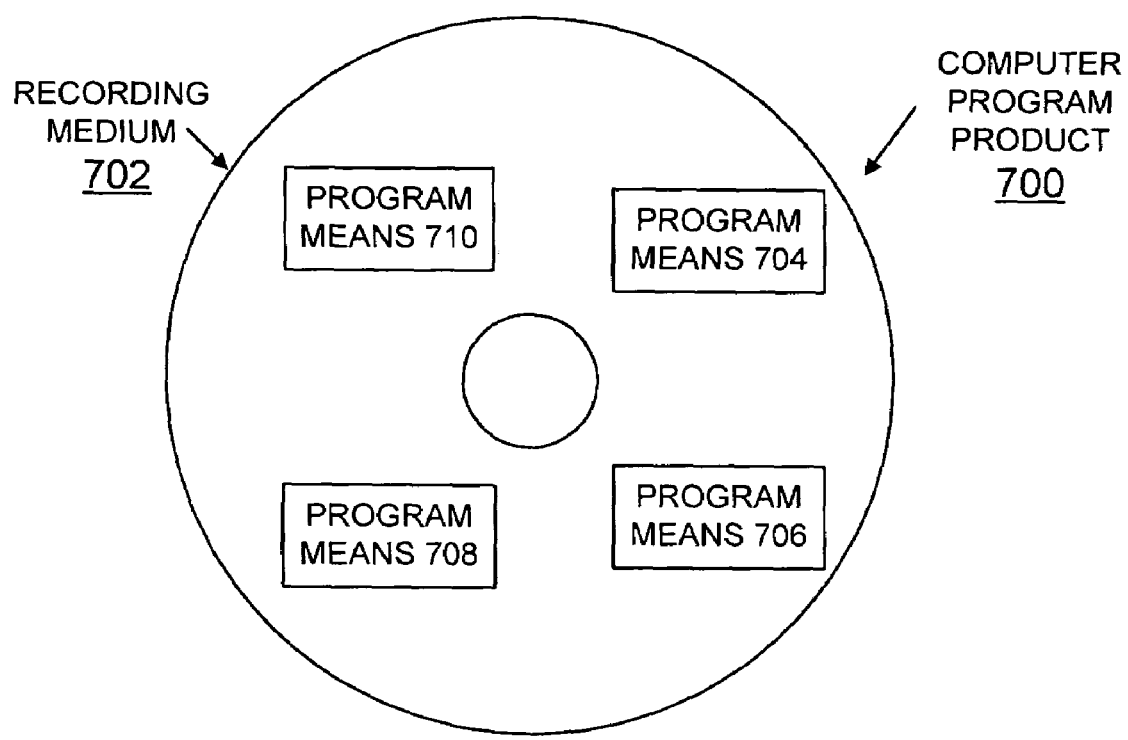
FIG. 7 is a block diagram illustrating a computer program product in accordance with the preferred embodiment.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, a transmission type media such as a digital or analog communications link, or a similar computer program product. Recording medium 702 stores program means 704, 706, 708, 710 on the medium 702 for carrying out the methods for implementing enhanced performance and reduced leakage current for application specific integrated circuit (ASIC) designs of the preferred embodiment in the system 400 of FIG. 4.

A sequence of program instructions or a logical assembly of one or more interrelated modules defined by the recorded program means 704, 706, 708, 710, direct the computer system 400 for implementing enhanced performance and reduced leakage current for application specific integrated circuit (ASIC) designs of the preferred embodiment.

While the present invention has been described with reference to the details of the embodiments of the invention shown in the drawing, these details are not intended to limit the scope of the invention as claimed in the appended claims.

What is claimed is:

1. A method for implementing enhanced performance and reduced leakage current for application specific integrated circuit (ASIC) designs comprising the steps of:
   identifying standard voltage threshold (SVT) circuits in a circuit library;
   for each SVT circuit, replacing each SVT P-channel field effect transistor (PFET) with a low voltage threshold (LVT) PFET and maintaining each N-channel field effect transistor (NFET) having a standard voltage threshold (SVT) to provide a hybrid alternate voltage threshold (AVT) circuit; and
   saving each said AVT circuit in an alternate circuit library.

2. A method for implementing enhanced performance and reduced leakage current as recited in claim 1 wherein the step of replacing each SVT PFET with a low voltage threshold (LVT) PFET includes the step of adding a low voltage threshold (LVT) mask over each said SVT PFET.

3. A method for implementing enhanced performance and reduced leakage current as recited in claim 2 wherein the step of adding a low voltage threshold (LVT) mask over each said SVT PFET includes the step of adding a single shape defining said low voltage threshold mask over an Nwell region to convert each said SVT PFET to said LTV PFET.

4. An alternate voltage threshold (AVT) circuit library comprising:
   a plurality of hybrid AVT circuits, each said hybrid AVT circuit including a plurality of P-channel field effect transistors (PFETs) and a plurality of N-channel field effect transistors (NFETs);
   each P-channel field effect transistor (PFET) having a low voltage threshold (LVT); and
   each N-channel field effect transistor (NFET) having a standard voltage threshold (SVT).

5. An alternate voltage threshold (AVT) circuit library as recited in claim 4 wherein said hybrid AVT circuits include a corresponding standard voltage threshold (SVT) circuit having a low voltage threshold (LVT) mask added over each said SVT PFET to convert each said SVT PFET to said LVT PFET.

6. An alternate voltage threshold (AVT) circuit library as recited in claim 4 wherein each said LVT PFET is provided in an Nwell Region isolated from each said NFET in each said hybrid AVT circuit.

7. A computer program product for implementing enhanced performance and reduced leakage current for application specific integrated circuit (ASIC) designs in a computer system, said computer program product including instructions executed by the computer system to cause the computer system to perform the steps of:
   identifying standard voltage threshold (SVT) circuits in a circuit library;
   for each SVT circuit, replacing each SVT P-channel field effect transistor (PFET) with a low voltage threshold (LVT) PFET and maintaining each N-channel field effect transistor (NFET) having a standard voltage threshold (SVT) to provide a hybrid alternate voltage threshold (AVT) circuit; and
   saving each said AVT circuit in an alternate circuit library.

8. A computer program product as recited in claim 7 wherein the step of replacing each SVT PFET with a low voltage threshold (LVT) PFET includes the step of adding a low voltage threshold (LVT) mask over each said SVT PFET.

9. A computer program product as recited in claim 8 wherein the step of adding a low voltage threshold (LVT) mask over each said SVT PFET includes the step of adding a single shape defining said low voltage threshold mask over an Nwell region to convert each said SVT PFET to said LTV PFET.

* * * * *